US012702070B2

(12) United States Patent (10) Patent No.: US 12,702,070 B2
Sugisawa et al. (45) Date of Patent: Aug. 4, 2026

(54) DISPLAY DEVICE

(71) Applicant: Alps Alpine Co., Ltd., Tokyo (JP)

(72) Inventors: Seiki Sugisawa, Miyagi-ken (JP);
Nahoko Sakamoto, Miyagi-ken (JP);
Takayuki Hirano, Miyagi-ken (JP);
Takashi Sato, Miyagi-ken (JP)

(73) Assignee: Alps Alpine Co., Ltd. (JP)

( * ) Notice: Subject to any disclaimer, the term of this
patent is extended or adjusted under 35
U.S.C. 154(b) by 346 days.

(21) Appl. No.: 18/466,128

(22) Filed: Sep. 13, 2023

(65) Prior Publication Data

US 2023/0420425 A1 Dec. 28, 2023

Related U.S. Application Data

(63) Continuation of application No.
PCT/JP2022/010050, filed on Mar. 8, 2022.

(30) Foreign Application Priority Data

Apr. 22, 2021 (JP) ................................. 2021-072625

(51) Int. Cl.
*H10W 90/00* (2026.01)
*B60K 35/22* (2024.01)
(Continued)

(52) U.S. Cl.
CPC ............. *H10W 90/00* (2026.01); *B60K 35/22*
(2024.01); *B60K 35/60* (2024.01); *H10H*
*20/84* (2025.01); *B60K 35/10* (2024.01)

(58) Field of Classification Search
CPC ... H01L 25/075; H01L 25/0753; B60K 35/10;
B60K 35/22; B60K 2360/691;
(Continued)

(56) References Cited

U.S. PATENT DOCUMENTS

| | | | |
|---|---|---|---|
| 10,720,089 | B2 | 7/2020 | Sakamaki et al. |
| 2012/0099292 | A1 | 4/2012 | Yim |

(Continued)

FOREIGN PATENT DOCUMENTS

| | | |
|---|---|---|
| DE | 102006029219 A1 | 12/2007 |
| DE | 112016005251 T5 | 8/2018 |

(Continued)

OTHER PUBLICATIONS

International Search Report issued in the corresponding PCT Application No. PCT/JP2022/010050; mailed on May 31, 2022 (total 2 pages).

(Continued)

*Primary Examiner* — Brook Kebede
(74) *Attorney, Agent, or Firm* — Harness, Dickey & Pierce, P.L.C.

(57) ABSTRACT

A display device has a panel having a display, a plurality of light sources and light guiding bodies provided side by side below the rear surface of the panel, and a case having holding spaces provided side by side below the rear surface of the panel, one light source and one light guiding body being placed in each of the plurality of holding spaces. The plurality of light sources selectively emit light so as to selectively display a plurality of indicator patterns at the display. A cover film is integrally formed on the surface of the panel. The upper surface of the case, facing the rear surface of the panel, has a plurality of exposing portions from which the upper ends of the plurality of light guiding bodies are exposed. Each exposing portion has the shape of the indicator pattern in a plan view.

5 Claims, 3 Drawing Sheets

(51) Int. Cl.
  *B60K 35/60*   (2024.01)
  *H10H 20/84*   (2025.01)
  *B60K 35/10*   (2024.01)

(58) Field of Classification Search
  CPC ........ B60K 2360/332; B60K 2360/336; B60K
     2360/34; B60K 35/60; B60Q 3/10; G02B
     6/0008; F21V 8/00; H10H 20/84; H10H
     20/855; H10W 90/00
  See application file for complete search history.

(56)     References Cited

U.S. PATENT DOCUMENTS

| | | | | |
|---|---|---|---|---|
| 2015/0253612 A1* | 9/2015 | Hasegawa | ......... | G02F 1/133308 |
| | | | | 349/58 |
| 2017/0229062 A1* | 8/2017 | Zeng | ...................... | G02B 6/009 |
| 2019/0187355 A1* | 6/2019 | An | ....................... | G02B 6/0026 |

FOREIGN PATENT DOCUMENTS

| | | | |
|---|---|---|---|
| EP | 1873001 | B1 | 12/2012 |
| JP | H09-257521 | A | 10/1997 |
| JP | 2009-139797 | A | 6/2009 |
| JP | 2011-246082 | A | 12/2011 |
| JP | 2018-049131 | A | 3/2018 |
| JP | 2020-106572 | A | 7/2020 |

OTHER PUBLICATIONS

Chinese Office Action issued in the corresponding Chinese Patent Application No. 202280021622.5; issued Mar. 11, 2026 (total 12 pages).

* cited by examiner

DISPLAY DEVICE

CLAIM OF PRIORITY

This application is a Continuation of International Application No. PCT/JP2022/010050 filed on Mar. 8, 2022, which claims benefit of Japanese Patent Application No. 2021-072625 filed on Apr. 22, 2021. The entire contents of each application noted above are hereby incorporated by reference.

BACKGROUND OF THE INVENTION

1. Field of the Invention

The present invention relates to a display device.

2. Description of the Related Art

In Japanese Unexamined Patent Application Publication No. 2005-067443, a technology is disclosed by which a translucent colored layer is provided over the entire front-side area of a dial plate so that indicators are made invisible while light-emitting diodes are turned off and a shielding colored layer is provided on the rear-side surface of the dial plate except the indicators.

In the technology described in Japanese Unexamined Patent Application Publication No. 2005-067443, however, the translucent colored layer is formed by printing, hot stamping, or the like. Therefore, the wear resistance of the front-side surface of the dial plate cannot be increased. Also, in the technology described in Japanese Unexamined Patent Application Publication No. 2005-067443, the indicators are disposed on the rear-side surface of the dial plate. Therefore, there is the fear that when an indicator eligible for being displayed is displayed by light emitted from the light-emitting diode, a nearby indicator not eligible for being displayed is visually recognized due to a leak of the light.

SUMMARY OF THE INVENTION

A display device according to an embodiment has: a panel having a display portion; a plurality of light sources disposed side by side on the same side as the rear surface of the panel; a plurality of light guiding bodies disposed side by side on the same side as the rear surface of the panel, the plurality of light guiding bodies guiding light emitted from the plurality of light sources toward the display portion of the panel; and a case having a plurality of spaces disposed side by side on the same side as the rear surface of the panel, one of the plurality of light sources and one of the plurality of light guiding bodies being placed in each of the plurality of spaces. The plurality of light sources selectively emit light, so that a plurality of indicator patterns of indicators are selectively displayed at the display portion. The panel has a surface on which a cover film is integrally formed. The upper surface of the case, the upper surface facing the rear surface of the panel, has a plurality of exposing portions from which the upper ends of the plurality of light guiding bodies are exposed. Each of the plurality of exposing portions has the shape of the indicator pattern in plan view.

According to an embodiment, it is possible to enhance wear resistance of the surface of a panel and to restrain a nearby indicator pattern not eligible for being displayed from being visually recognized when a light source corresponding to an indicator pattern eligible for being displayed is turned on.

DESCRIPTION OF THE PREFERRED EMBODIMENTS

Figure 1:
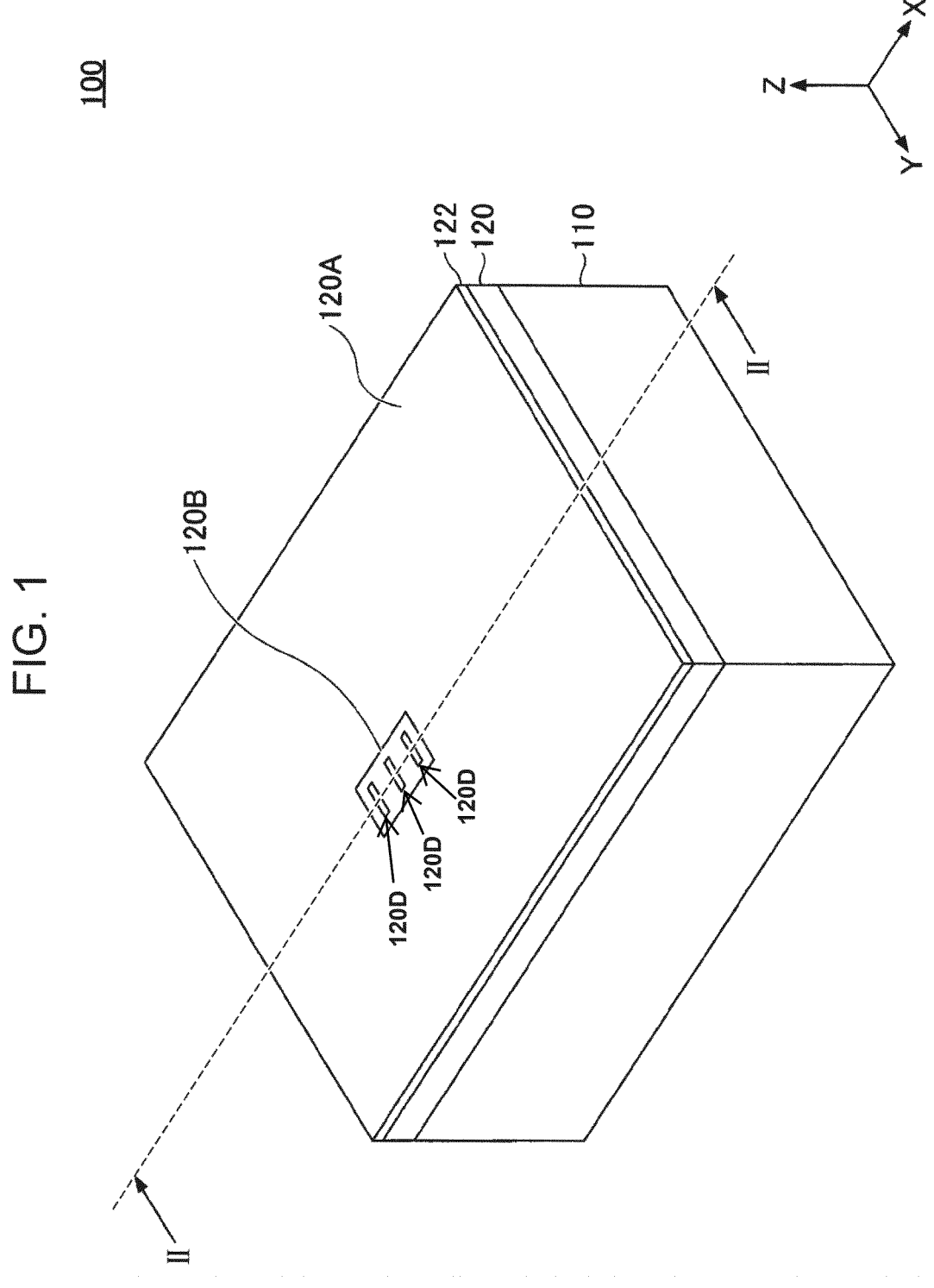
FIG. 1 is a perspective view illustrating the outside shape of a display device according to an embodiment.

An embodiment of the present invention will be described with reference to the drawings. In the description below, the Z-axis direction in the drawings will be taken as the up-down direction, the X-axis direction in the drawings will be taken as the front-back direction, and the Y-axis direction in the drawings will be taken as the left-right direction (an example of a third direction), for convenience of explanation. In addition, the positive X-axis direction will be taken as the forward direction, the positive Y-axis direction will be taken as the left direction, and the positive Z-axis direction will be taken as the upward direction. A line of vision when the negative Z-axis direction is viewed from the positive Z-axis direction will be taken as a plan view. However, these directions just indicate relative positional relationships in the device and do not restrict the installation direction and manipulation direction of the device. When the relative positional relationships of constituent parts in the device are equivalent, even if the constituent parts are in different installation direction or manipulation directions, all of the constituent parts are included in the scope of rights. In addition, in the drawings, constituent parts may be illustrated by being exaggeratedly made thicker than actual ratios among constituent parts for easy explanation of the constituent parts. However, the constituent parts are not limited to the ratios illustrated in the drawings. The thickness relationships of the constituent parts can be appropriately changed.

Outline of a Display Device 100

FIG. 1 is a perspective view illustrating the outside shape of a display device 100 in this embodiment. The display device 100 illustrated in FIG. 1 is mounted in, for example, a cabin in a vehicle such as an automobile, and displays various types of information about the vehicle. The display device 100 has a case 110 and a panel 120 placed on the top of the case 110, as illustrated in FIG. 1. A cover film 122 is attached to the front surface 120A of the panel 120. A display portion 120B in a rectangular shape in plan view is provided at the center of the panel 120.

The display device 100 can selectively turn on three light-emitting diodes (LEDs) 132 (see FIG. 2) disposed in the case 110, according to the state of a target unit (such as, for example, the amount of air from an air conditioner). Therefore, the display device 100 can display a maximum of three indicators, each of which has a predetermined indicator pattern 120D (in this embodiment, a rectangular shape) at the display portion 120B, according to the state of the target unit. Each indicator pattern 120D indicated in FIG. 1 is visually recognized at the display portion 120B when light emitted from the relevant LED 132 is guided to the upper end face 150C (see FIG. 2) of a light guiding body 150, as described later.

With the display device 100, while all of the three LEDs 132 are turned off, any of the three indicators is not displayed at the display portion 120B and any of the three indicator patterns 120D (in this embodiment, rectangular shapes) cannot be visually recognized (a so-called blackout is caused).

Figure 2:
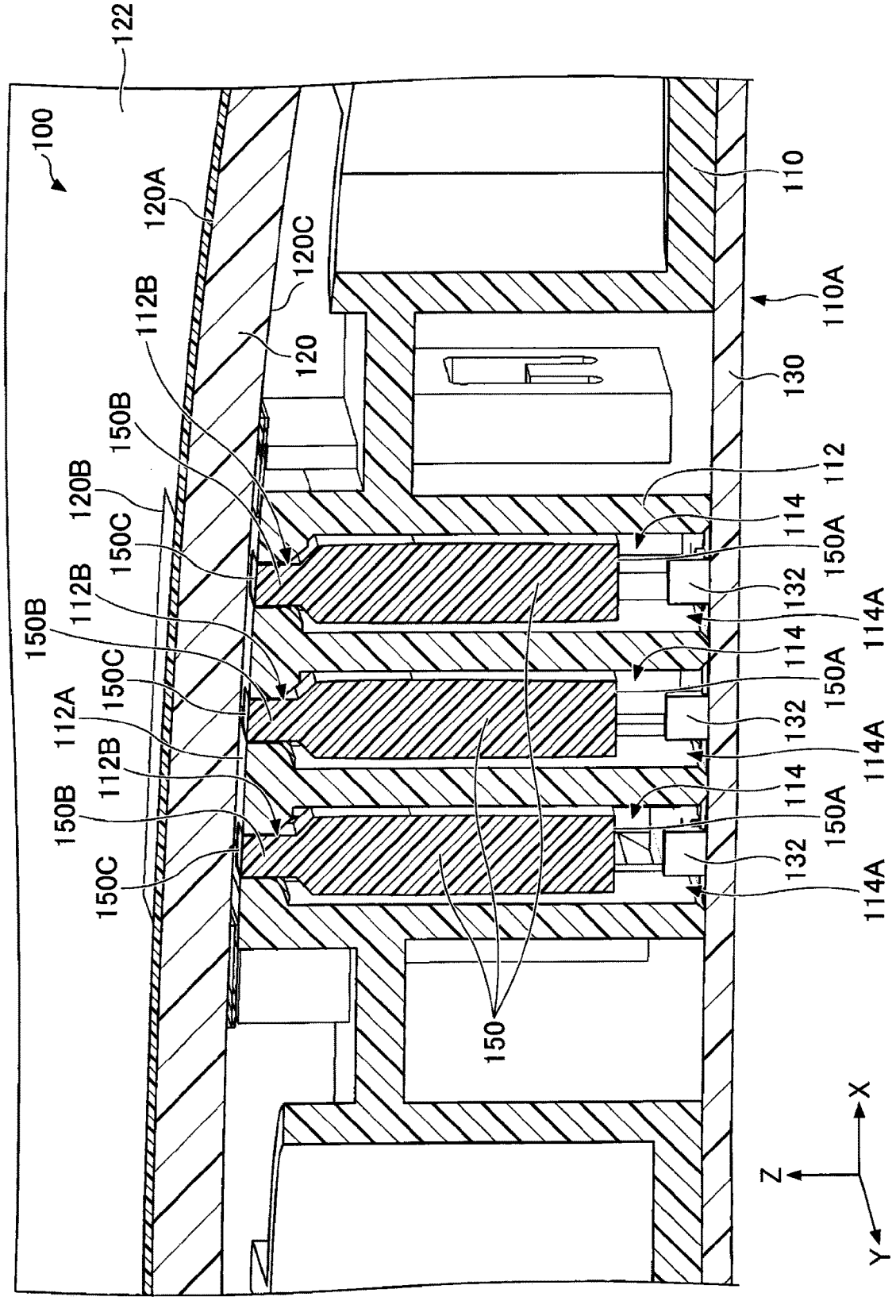
FIG. 2 is a partially enlarged perspective sectional view illustrating an enlarged cross section of the display device according to the embodiment as taken along line II-II.

FIG. 2 is a partially enlarged perspective sectional view illustrating an enlarged cross section of the display device 100 in this embodiment as taken along line II-II. The display device 100 has the panel 120 at the upper portion and also has the case 110, a circuit board 130, a plurality of LEDs 132, and a plurality of light guiding bodies 150 on the same side as the rear surface of the panel 120, as illustrated in FIG. 2.

The case 110 is a box-like member having a holding section 112 that holds the light guiding bodies 150 in the interior of the case 110. The case 110 is formed by being injection-molded from a resin material. Particularly, in this embodiment, a white resin having a light shielding property is used for the case 110. The interior of the case 110 has a hollow structure, in which the circuit board 130, the plurality of LEDs 132, and the plurality of light guiding bodies 150 are placed, and also has a lower opening 110A leading to the hollow structure. Although, in the example illustrated in FIG. 1, the case 110 has a rectangular parallelepiped shape, this is not a limitation. The case 110 may have any shape. Also, the case 110 may be formed from a resin in any color without being limited to white.

In this embodiment, the holding section 112 has three holding spaces 114, in which the three light guiding bodies 150 are held. The three holding spaces 114 are formed side by side in the X-axis direction. Each holding space 114 has a cylindrical shape extending in the up-down direction (Z-axis direction). The light guiding body 150 is held in the interior of the cylinder of the holding space 114. Although, in this embodiment, the holding space 114 has a quadrangular cylindrical shape, the holding space 114 may have any other shape (for example, a circular cylindrical shape). The upper surface 112A of the holding section 112 faces the rear surface 120C of the panel 120. A plurality of exposing portions 112B are formed in the upper surface 112A of the holding section 112, which are holes that extend through the holding section 112 in the up-down direction and lead to the holding spaces 114. In this embodiment, three exposing portions 112B are formed in the upper surface 112A of the holding section 112, side by side in the X-axis direction. The upper end 150B of the light guiding body 150 is inserted into and disposed in the exposing portion 112B. The shape of the exposing portion 112B in plan view is substantially the same as the shape of the upper end 150B of the light guiding body 150 (in this embodiment, a rectangular shape), and the exposing portion 112B has the same size as the upper end 150B. That is, the shape of the exposing portion 112B in plan view is the shape of the design displayed at the display portion 120B. A lower opening 114A in each holding space 114 is closed because the circuit board 130 is in contact with the lower opening 114A.

The panel 120 is a flat-plate-like member facing the upper surface 112A of the holding section 112 of the case 110. On the front surface 120A of the panel 120, a cover film 122 is integrally formed and is pressure-bonded. The panel 120 and cover film 122 have a light transmissive property. The cover film 122 is formed from a resin material having a wear resistance and a light shielding property (a polycarbonate resin, an acrylic resin, or the like, for example). The panel 120 is formed from a light transmissive resin having a smoke color (a polycarbonate resin, an acrylic resin, or the like, for example). A film with any design (a pattern, a figure, letters, or the like) printed on the rear surface can be used as the cover film 122.

Each of the plurality of light guiding bodies 150 guides light emitted from the relevant LED 132 to the display portion 120B of the panel 120. One light guiding body 150 is provided for each LED 132. The display device 100 in this embodiment has three light guiding bodies 150 in correspondence to the three LEDs 132. Each light guiding body 150 is formed from a light transmissive resin material having a light transmissive property (a polycarbonate resin, an acrylic resin, or the like, for example).

Each light guiding body 150 is placed and held in one holding space 114 in the holding section 112 of the case 110. The light guiding body 150 has a columnar shape, the longitudinal direction of which matches the up-down direction (Z-axis direction). Although, in this embodiment, the light guiding body 150 has a quadrangular columnar shape, the light guiding body 150 may have any other shape (a circular cylindrical shape, for example). In the holding space 114, each light guiding body 150 is disposed above the relevant LED 132. That is, the lower end face 150A of each light guiding body 150 faces the relevant LED 132. Therefore, light emitted from the LED 132 enters the interior of the light guiding body 150 from the lower end face 150A of the light guiding body 150.

The upper end 150B is a thin part of the light guiding body 150. The upper end 150B of each light guiding body 150 is inserted into and disposed in the exposing portion 112B formed in the upper surface 112A of the holding section 112. Therefore, the upper end face 150C of the upper end 150B of the light guiding body 150 is exposed from the exposing portion 112B and faces the display portion 120B (rear surface 120C) of the panel 120. Therefore, light that has entered the light guiding body 150 and has propagated in the light guiding body 150 exits from the upper end face 150C of the light guiding body 150 toward the display portion 120B and is then visually recognize in the shape of the upper end face 150C (exposing portion 112B) in plan view at the display portion 120B.

The circuit board 130 is a flat-plate-like member horizontally placed in the case 110. A printed wired board (PWB), for example, is used as the circuit board 130. Various types of electronic parts are mounted on the circuit board 130. A plurality of LEDs 132 are mounted on the front surface of the circuit board 130. In this embodiment, three LEDs 132 are disposed side by side in the X-axis direction on the front surface of the circuit board 130, as an example.

The LED 132 is an example of a light source. When the LED 132 is driven by an electronic circuit formed on the circuit board 130, the LED 132 emits light toward the above of the LED 132. The electronic circuit formed on the circuit board 130 is electrically connected to the outside of the display device 100 through any of various types of wiring members (such as, for example, connectors, FPCs, and cables). Therefore, light emission by the LED 132 can be controlled from the outside of the display device 100.

With the display device 100 in this embodiment, the upper surface 112A, facing the rear surface 120C of the panel 120, of the case 110 (specifically, the holding section 112) has a plurality of exposing portions 112B, through which the upper ends 150B of the plurality of light guiding bodies 150 are exposed. Each exposing portion 112B has, in plan view, the shape (specifically, the designed shape) of a rectangular indicator pattern 120D displayed at the display portion 120B.

That is, with the display device 100 in this embodiment, the shapes of the plurality of indicator patterns 120D, light being capable of passing through only these indicator patterns 120D, are not formed at the panel 120 and cover film 122, but light passes through the plurality of exposing portions 112B disposed on the same side as the upper surface 112A of the case 110, the upper surface 112A facing the panel 120 and cover film 122, in the shapes of the plurality of indicator patterns 120D.

Therefore, the display device 100 in this embodiment suppresses the problem that a nearby indicator, which is not eligible for being displayed, is visually recognized unlike when a shape is provided in an indicator pattern 120D in which light can be passed to the front surface 120A of the panel 120, the front surface 120A being distant from the upper end 150B of the light guiding body 150. Specifically, since the exposing portion 112B, through which light can be passed, is provided at the position of the upper end 150B of the light guiding body 150, when an indicator pattern eligible for being displayed is displayed by light emitted from the LED 132, it is possible to suppress a light leak from a nearby indicator pattern, which is not eligible for being displayed, the light leak being caused by diffusion of the light in the panel 120 or internal reflection.

Figure 3:
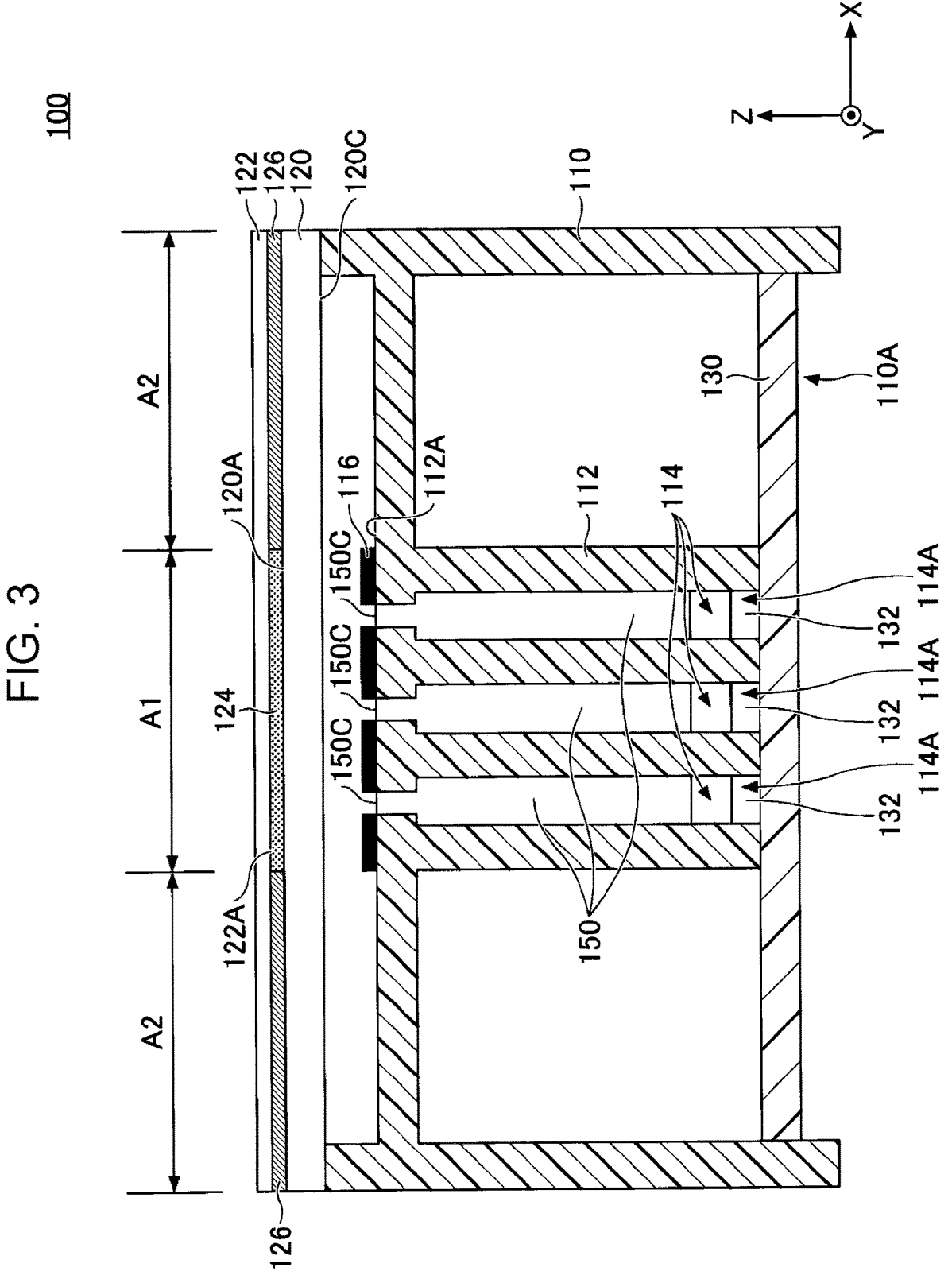
FIG. 3 is a schematic diagram illustrating the structure of the display device according to the embodiment.

FIG. 3 is a schematic diagram illustrating the structure of the display device 100 in this embodiment. The cover film 122 is integrally formed on the front surface 120A of the panel 120, as illustrated in FIG. 3.

A first area A1 is allocated at a central portion on the rear surface 122A of the cover film 122. The first area A1 includes the plurality of exposing portions 112B in plan view, and corresponds to the area of the display portion 120B (see FIG. 1). Although, in this embodiment, the first area A1 has a rectangular shape in plan view, the first area A1 may be in any other shape. In the first area A1 on the rear surface 122A of the cover film 122, a smoke layer 124 is preferably formed by printing.

A second area A2 is also allocated around the periphery of the first area A1 on the rear surface 122A of the cover film 122. In the second area A2 on the rear surface 122A of the cover film 122, a light shielding layer 126 is preferably formed by printing.

Therefore, with the display device 100 in this embodiment, light emitted from the LED 132 is passed through the first area A1 of the cover film 122 and light emitted from the LED 132 is not passed through the second area A2 of the cover film 122.

With the display device 100 in this embodiment, since the smoke layer 124 is provided in the first area A1 of the cover film 122, while the LED 132 is turned on, almost all of the light exited from the exposing portion 112B can be transmitted to the outside and the light can be made hard to reflect to the interior of the case 110. In addition, since the smoke layer 124 is provided, while the LED 132 is turned off, external light can be made hard to enter the interior of the case 110 to make it hard to see the indicator pattern 120D of the exposing portion 112B and to cause the indicator pattern 120D to be blacked out.

With the display device 100 in this embodiment, reflection attenuating layers 116 are preferably formed by printing in black or coating in black in areas, in the upper surface 112A of the case 110, facing the first area A1, as illustrated in FIG. 3.

Therefore, with the display device 100 in this embodiment, while the LED 132 is turned on, even if light exited from the exposing portion 112B toward the panel 120 is reflected on the rear surface 120C of the panel 120 or the rear surface (smoke layer 124 or light shielding layer 126) of the cover film 122 and is returned, the reflection attenuating layer 116 can make it hard for the light to reflect and can attenuate the light. Therefore, the display device 100 in this embodiment can restrain the designed shape of a nearby indicator pattern 120D (that is, the shape of an adjacent exposing portion 112B) from being visually recognized due to light exited from the exposing portion 112B. The display device 100 in this embodiment can also restrain the designed shape of an indicator pattern 120D (that is, the shape of the exposing portion 112B) from being visually recognized due to external light that has entered the interior of the case 110.

Particularly, in this embodiment, the reflection attenuating layer 116 is preferably formed by printing in matte black or coating in matte black.

Therefore, with the display device 100 in this embodiment, it is possible to enhance power to attenuate light (light reflected toward the interior due to light exited from the exposing portion 112B or external light) by the reflection attenuating layer 116. Therefore, with the display device 100 in this embodiment, it is possible to further enhance nonvisibility of a nearby indicator pattern 120D, which is not eligible for being displayed.

However, the reflection attenuating layer 116 may be formed by printing in gloss black or coating in gloss black without being limited to the above.

The reflection attenuating layer 116 is preferably larger than the first area A1 in size in plan view. Therefore, even when the display portion 120B is viewed from above at an oblique angle, it is possible to prevent a portion, on the upper surface 112A of the case 110, in which the reflection attenuating layer 116 is not formed (a portion in white, for example) from being visually recognized, so a blackout can be surely caused.

With the display device 100 in this embodiment, the front surface 120A of the panel 120 has a curved surface (see FIG. 2). In this case as well, the cover film 122 can be integrally formed on the front surface 120A of the panel 120.

Therefore, with the display device 100 in this embodiment, the cover film 122 can be easily brought into tight contact with the front surface 120A of the panel 120 and can be integrated with the front surface 120A unlike when the cover film 122 is attached to the front surface 120A of the panel 120 with an adhesive or the like.

With the display device 100 in this embodiment, the case 110 is preferably formed from a white resin having a light shielding property.

Therefore, with the display device 100 in this embodiment, even if light leaks from the light guiding body 150 to the interior of the holding space 114, the case 110 (specifically, the inner walls of the holding spaces 114), which holds the light guiding bodies 150, can reflect the reflected light to the interior of the light guiding body 150 it is possible to enhance the efficiency of transmitting light from the LED 132 to the upper end face 150C of the light guiding bodies 150.

This completes the description of the embodiment of the present invention. However, the present invention is not limited to the embodiment but can be varied and modified in various ways without departing from the intended scope, described in the claims, of the present invention.

What is claimed is:

1. A display device comprising:
   a panel having a display portion;
   a plurality of light sources disposed side by side on the same side as a rear surface of the panel;
   a plurality of light guiding bodies disposed side by side on the same side as the rear surface of the panel, the plurality of light guiding bodies guiding light emitted from the plurality of light sources toward the display portion of the panel; and a case having a plurality of spaces disposed side by side on the same side as the rear surface of the panel, one of the plurality of light sources and one of the plurality of light guiding bodies being placed in each of the plurality of spaces, wherein the plurality of light sources selectively emit the light so that a plurality of indicator patterns are selectively displayed at the display portion, the panel has a surface on which a cover film is integrally formed, an upper surface of the case has a plurality of exposing portions from which upper ends of the plurality of light guiding bodies are exposed, and each of the plurality of exposing portions has a shape of one of the plurality of indicator patterns in a plan view, and the upper surface of the case faces the rear surface of the panel.

2. The display device according to claim 1, wherein, on a rear surface of the cover film, a smoke layer is printed in a first area, which includes the plurality of exposing portions in the plan view, and a light shielding layer is printed in a second area around a periphery of the first area, a first indicator pattern of the plurality of indicator patterns corresponds to a first source of the plurality of light sources, and the first light source does not emit the light, and the first indicator is blacked out at the display portion via the smoke layer.

3. The display device according to claim 2, wherein, on the upper surface of the case, a reflection attenuating layer, formed by printing in black or coating in black, is provided in an area facing the first area of the rear surface of the cover film.

4. The display device according to claim 3, wherein the reflection attenuating layer is formed by printing in matte black or coating in matte black.

5. The display device according to claim 1, wherein the case is formed from a white resin having a light shielding property.

* * * * *